United States Patent [19]
Sato et al.

[11] Patent Number: 5,926,037
[45] Date of Patent: Jul. 20, 1999

[54] BUFFER CIRCUIT WHICH TRANSFERS DATA HELD IN A FIRST LATCH CIRCUIT TO A SECOND LATCH CIRCUIT

[75] Inventors: Fumiki Sato; Kouichi Fujita, both of Tokyo, Japan

[73] Assignee: Mitsubishi Denki Kabushiki Kaisha, Tokyo, Japan

[21] Appl. No.: 08/890,619

[22] Filed: Jul. 9, 1997

Related U.S. Application Data

[30] Foreign Application Priority Data

Mar. 3, 1997 [JP] Japan .................................. 9-048213

[51] Int. Cl.⁶ .................. H03K 19/0175; H03K 19/094; G11C 7/00
[52] U.S. Cl. .............................. 326/83; 326/17; 365/205
[58] Field of Search ................... 326/83, 82, 86, 326/17, 121; 365/205, 189.05

[56] References Cited

U.S. PATENT DOCUMENTS

| | | | |
|---|---|---|---|
| 4,739,499 | 4/1988 | Simpson | 365/205 |
| 4,804,871 | 2/1989 | Walters, Jr. | 327/54 |
| 4,937,480 | 6/1990 | Higuchi et al. | 327/433 |
| 5,228,106 | 7/1993 | Ang et al. | 365/208 |
| 5,325,335 | 6/1994 | Ang et al. | 365/205 |
| 5,508,644 | 4/1996 | Branson et al. | 327/57 |
| 5,872,736 | 2/1999 | Keeth | 365/189.05 |

*Primary Examiner*—Michael Tokar
*Assistant Examiner*—Daniel D. Chang
*Attorney, Agent, or Firm*—Burns, Doane, Swecker & Mathis, LLP

[57] ABSTRACT

A buffer circuit which can solve a problem of a conventional buffer circuit in that high speed data transfer is hindered because of parasitic capacitance of signal lines, which has an affect on the discharge time of inverters in a latch circuit of the buffer circuit, when the buffer circuit changes its state from a first term (non-transfer mode) to a second term (transfer mode). The buffer circuit solves this problem by pouring a current, which flows thereinto from a first signal line, into ground through a first PMOS transistor, a first NMOS transistor and a third NMOS transistor, and by pouring a current, which flows thereinto from a second signal line, into the ground through a second PMOS transistor, a second NMOS transistor and the third NMOS transistor.

16 Claims, 15 Drawing Sheets

BUFFER CIRCUIT WHICH TRANSFERS
DATA HELD IN A FIRST LATCH CIRCUIT
TO A SECOND LATCH CIRCUIT

BACKGROUND OF THE INVENTION

1. Field of the Invention

The present invention relates to a buffer circuit which transfers data held in a first latch circuit to a second latch circuit.

2. Description of Related Art

FIG. 14 is a circuit diagram showing a conventional buffer circuit. In this figure, the reference numerals 1 and 2 each designate a signal line; 3 and 4 each designate a control signal line; 5 designates a bistable latch circuit; 6 designates an inverter for inverting the output of an inverter 7 which in turn inverts the output of the inverter 6; and 8 and 9 each designate an NMOS transistor which has its gate electrode connected to the control signal line 3, and which transfers to a nonconducting state when the signal level of the control signal line 3 falls to L level (the ground level), and to a conducting state when the signal level rises to H level (a supply voltage level).

The reference numerals 10–13 each designate a power supply; 14 and 15 each designate a PMOS transistor which has its gate electrode connected to the control signal line 4, and which changes into conducting state when the signal level of the control signal line 4 is placed at L level, and into nonconducting state when the signal level of the control signal line 4 is placed at H level; 16 designates a PMOS transistor which has its gate electrode connected to the signal line 2, and which changes into the conducting state when the signal level of the signal line 2 is placed at L level, and changes into the nonconducting state when the signal level of the signal line 2 is placed at H level; and 17 designates a PMOS transistor which has its gate electrode connected to the signal line 1, and which changes into the conducting state when the signal level of the signal line 1 is placed at L level, and changes into the nonconducting state when the signal level of the signal line 1 is placed at H level.

The reference numeral 18 designates a latch circuit for holding data transferred from the latch circuit 5, 19 designates an NAND gate having a first input terminal connected to the signal line 1 and a second input terminal connected to the output terminal of an NAND gate 20 which in turn has its first input terminal connected to the signal line 2 and its second input terminal connected to the output terminal of the NAND gate 19.

Next, the operation will be described separately for the two cases: A first term (non-transfer mode) during which the signal levels of the control signal lines 3 and 4 are both L level; and a second term (transfer mode) during which they are both H level.

First, the operation in the first term will be described with reference to FIG. 15 which shows signal levels of various portions and the state of the transistors. Here, it is assumed for convenience' sake that the output of the inverter 6 is L level and the output of the inverter 7 is H level.

First, since the signal level of the control signal line 3 is L level during the first term, the signal levels of the gate electrodes of the NMOS transistors 8 and 9 are L level, and hence the NMOS transistors 8 and 9 are placed at the nonconducting state.

Accordingly, the latch circuit 5 is isolated from the signal lines 1 and 2, and the data of the latch circuit 5 cannot be transferred to the latch circuit 18 in the first term.

In addition, since the signal level of the control signal line 4 is L level, the signal levels of the gate electrodes of the PMOS transistors 14 and 15 are L level, and hence the PMOS transistors 14 and 15 are placed at the conducting state.

Accordingly, the power supply 10 is connected to the signal line 1 through the PMOS transistor 14, and the power supply 11 is connected to the signal line 2 through the PMOS transistor 15, thereby raising the signal levels of the signal lines 1 and 2 to H level.

Therefore, the H level signals are input to the first input terminals of the NAND gates 19 and 20 (the input terminals connected to the signal lines 1 and 2) which constitute the latch circuit 18. Accordingly as shown in FIG. 15, if the NAND gate 19 outputs an L level signal, the NAND gate 20 outputs an H level signal. Reversely, if the NAND gate 19 outputs an H level signal, the NAND gate 20 outputs an L level signal.

This means that the latch circuit 18 maintains holding the prestored data independently of the data held by the latch circuit 5 in the first term.

Second, the operation in the second term will be described with reference to FIG. 16 which shows signal levels of various portions and the state of the transistors. Here, it is assumed for convenience' sake that the output of the inverter 6 is L level and the output of the inverter 7 is H level.

First, since the signal level of the control signal line 3 is H level during the second term, the signal levels of the gate electrodes of the NMOS transistors 8 and 9 are H level, and hence the NMOS transistors 8 and 9 are placed at the conducting state.

Accordingly, the latch circuit 5 is connected to the signal lines 1 and 2, so that the data of the latch circuit 5 can be transferred to the latch circuit 18 in the second term.

In addition, since the signal level of the control signal line 4 is also H level, the signal levels of the gate electrodes of the PMOS transistors 14 and 15 are H level, and hence the PMOS transistors 14 and 15 are placed at the nonconducting state.

Accordingly, the signal line 1 is isolated from the power supply 10, and the signal level of the signal line 1, affected by the signal level of the output of the inverter 7, is placed at H level.

Likewise, the signal line 2 is isolated from the power supply 11, and the signal level of the signal line 2, affected by the signal level of the output of the inverter 7, is placed at L level.

In this case, since the signal level of the signal line 2 in the first term has been placed at H level, it must be changed to L level by discharging the voltage applied to the signal line 2 through the inverters 6 and 7.

Thus, the H level signal is input to the first input terminal of the NAND gate 19 (the input terminal connected to the signal line 1), and the L level signal is input to the first input terminal of the NAND gate 20 (the input terminal connected to the signal line 2). Accordingly, the NAND gate 20 outputs an H level signal, and the NAND gate 19 outputs an L level signal.

This means that the NAND gate 19 of the latch circuit 18 holds the same data as that held in the inverter 6 of the latch circuit 5, and the NAND gate 20 of the latch circuit 18 holds the same data as that held in the inverter 7 of the latch circuit 5.

The conventional latch circuit thus arranged can transfer the data held by the inverters 6 and 7 constituting the latch circuit 5 to the latch circuit 18. This, however, presents a problem in that high speed data transfer can be hindered during the transition from the first term to the second term because the time taken by the discharge through the inverters 6 and 7 cannot be ignored when the parasitic capacitance of the signal lines 1 and 2 is not negligible.

SUMMARY OF THE INVENTION

The present invention is implemented to solve the foregoing problem. It is therefore an object of the present invention to provide a buffer circuit capable of achieving the high speed data transfer in spite of rather large parasitic capacitance of the signal lines.

According to the present invention, there is provided a buffer circuit carrying out data transfer from a first latch circuit to a second latch circuit through a first signal line and a second signal line in response to control signals applied to a first control signal line and a second control signal line, each of the first signal line and the second signal line being connected to a power supply, and the first latch circuit having a first output terminal and a second output terminal, each of which is connected to one of the first signal line and the second signal line through a transistor whose gate is connected to the first control signal line, the buffer circuit comprising: a sense amplifier having a first input terminal connected to the first signal line and a second input terminal connected to the second signal line, the sense amplifier pouring a current, which flows into the sense amplifier from the first input terminal, into ground through a first transistor and a third transistor whose gate electrode is connected to the second control signal line, and pouring a current, which flows into the sense amplifier from the second input terminal, into the ground through a second transistor and the third transistor, the second transistor having a resistance equivalent to that of the first transistor; and data transfer means for transferring logic signals to a first input terminal and a second input terminal of the second latch circuit, the logic signals corresponding to compared results obtained by the data transfer means which compares an output side voltage of the first transistor of the sense amplifier with a reference voltage and compares an output side voltage of the second transistor of the sense amplifier with the reference voltage.

Here, the first transistor in the sense amplifier may comprise a first PMOS transistor having its source electrode connected to the first signal line, and its drain electrode connected to the data transfer means; the second transistor in the sense amplifier may comprise a second PMOS transistor having its source electrode connected to the second signal line, and its drain electrode connected to the data transfer means; and the third transistor in the sense amplifier may comprise a first NMOS transistor having its drain electrode connected to the drain electrode of the first PMOS transistor, and its gate electrode connected to a gate electrode of the second PMOS transistor, a second NMOS transistor having its drain electrode connected to the drain electrode of the second PMOS transistor, and its gate electrode connected to a gate electrode of the first PMOS transistor, and a third NMOS transistor having its drain electrode connected to the source electrodes of the first NMOS transistor and the second NMOS transistor, its source electrode connected to the ground, and its gate electrode connected to the second control signal line.

The sense amplifier may apply a voltage higher than the reference voltage to the drain electrodes of the first PMOS transistor and the second PMOS transistor, when the output terminals of the first latch circuit are isolated from the first signal line and the second signal line.

The data transfer means may comprise a first switching circuit for isolating the first input terminal of the second latch circuit from the ground when the output side voltage of the first transistor is higher than the reference voltage, and for connecting the first input terminal of the second latch circuit to the ground when the output side voltage of the first transistor is lower than the reference voltage; and a second switching circuit for isolating the second input terminal of the second latch circuit from the ground when the output side voltage of the second transistor is higher than the reference voltage, and for connecting the second input terminal of the second latch circuit to the ground when the output side voltage of the second transistor is lower than the reference voltage.

Each of the first switching circuit and the second switching circuit may comprise an inverter for inverting a logic level of the output side voltage of one of the first transistor and the second transistor, and a transistor for having one of the first and second input terminals of the second latch circuit isolated from the ground when the logic level output from the inverter is a low level, and having it connected to the ground when the logic level output from the inverter is a high level; and the second latch circuit may comprises a fourth NMOS transistor having its source electrode connected to an output terminal of the inverter of the second switching circuit, and its gate electrode connected to a drain electrode of the transistor of the second switching circuit, a fifth NMOS transistor having its source electrode connected to an output terminal of the inverter of the first switching circuit, and its gate electrode connected to a drain electrode of the transistor of the first switching circuit, a third PMOS transistor having its drain electrode connected to a drain electrode of the fourth NMOS transistor, its source electrode connected to a power supply, and its gate electrode connected to a drain electrode of the fifth NMOS transistor, and a fourth PMOS transistor having its drain electrode connected to the drain electrode of the fifth NMOS transistor, its source electrode connected to a power supply, and its gate electrode connected to the drain electrode of the fourth NMOS transistor.

The data transfer means may carry out a predetermined logical operation in response to the compared results, and may transfer logic signals corresponding to logical operation results to the first input terminal and the second input terminal of the second latch circuit.

The buffer circuit may further comprise a current breaking means for changing a state of the first transistor and the second transistor into a nonconducting state when at least one of the output side voltages of the first transistor and the second transistor drops below the reference voltage.

BRIEF DESCRIPTION OF THE DRAWINGS

FIGS. 4A and 4B are graphs showing data transfer times, wherein FIG. 4A illustrates the data transfer of the embodiment 1, and FIG. 4B illustrates that of a conventional buffer circuit;

DETAILED DESCRIPTION OF THE PREFERRED EMBODIMENTS

The invention will now be described with reference to the accompanying drawings.

Embodiment 1

Figure 1:
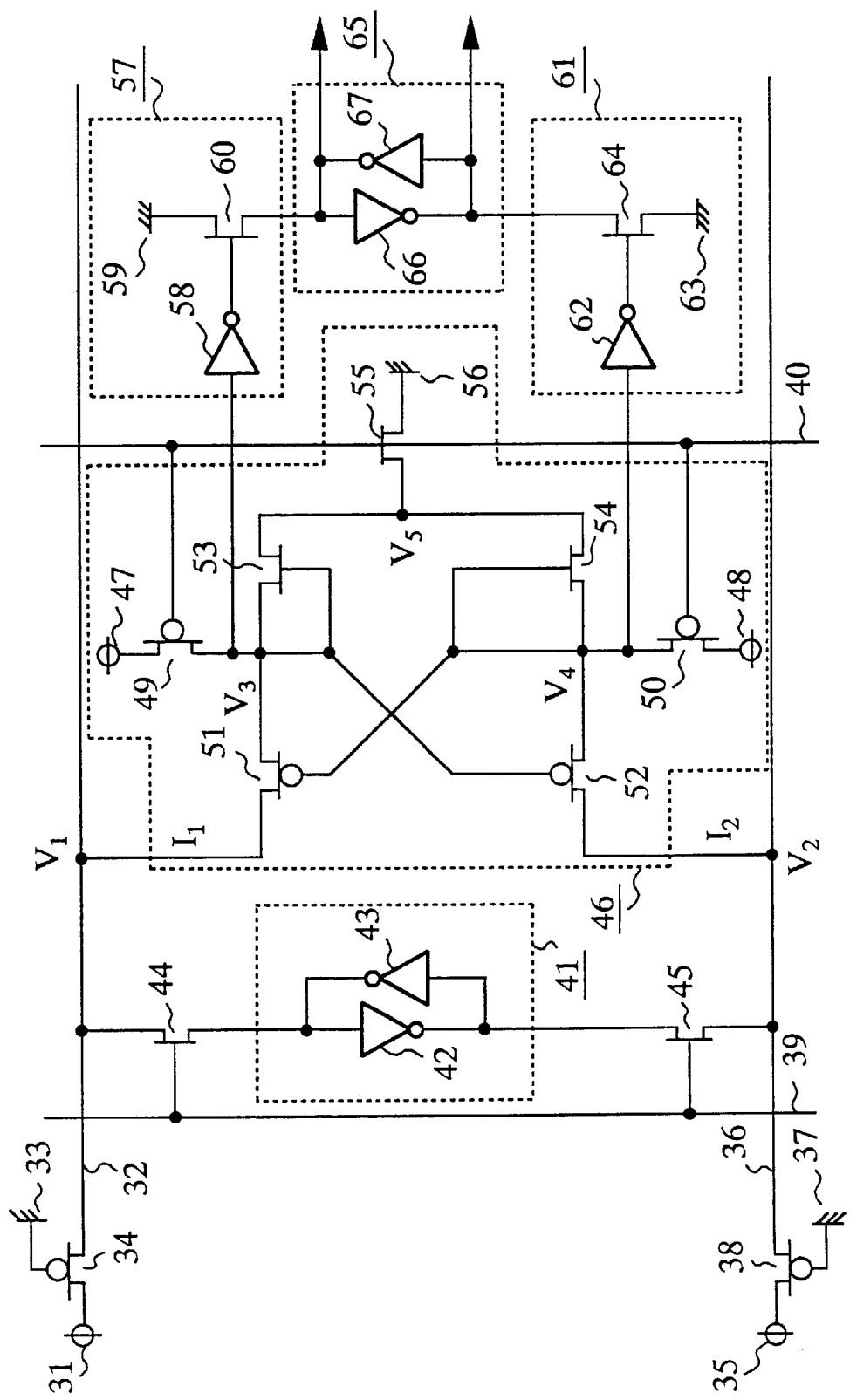
FIG. 1 is a circuit diagram showing an embodiment 1 of the buffer circuit in accordance with the present invention.

FIG. 1 is a circuit diagram showing an embodiment 1 of a buffer circuit in accordance with the present invention. In this figure, the reference numeral 31 designates a power supply; 32 designates a signal line (first signal line); 33 designates a ground; 34 designate a PMOS transistor having its source electrode connected to the power supply 31, its drain electrode connected to the signal line 32, and its gate electrode connected to the ground 33; 35 designates a power supply; 36 designates a signal line (second signal line); 37 designates the ground; 38 designate a PMOS transistor having its source electrode connected to the power supply 35, its drain electrode connected to the signal line 36, and its gate electrode connected to the ground 37; and 39 and 40 each designate a control signal line.

The reference numeral 41 designates a bistable latch circuit (first latch circuit); 42 designates an inverter for inverting the output of an inverter 43 which in turn inverts the output of the inverter 42; and 44 and 45 each designate an NMOS transistor which has its gate electrode connected to the control signal line 39, and which transfers to the nonconducting state when the signal level of the control signal line 39 falls to L level (the ground level), and to the conducting state when the signal level rises to H level (the supply voltage level).

The reference numeral 46 designates a sense amplifier which has its first input terminal connected to the signal line 32, and its second input terminal connected to the signal line 36, which pours a current $I_1$ fed through the first input terminal to the ground 56 through a PMOS transistor 51 and NMOS transistors 53 and 55, and which pours a current $I_2$ fed through the second input terminal to the ground 56 through a PMOS transistor 52 and NMOS transistors 54 and 55.

The reference numerals 47 and 48 each designate a power supply; 49 designates a PMOS transistor having its source electrode connected to the power supply 47, its drain electrode connected to the drain electrode of the PMOS transistor 51, and its gate electrode connected to the control signal line 40; and 50 designates a PMOS transistor having its source electrode connected to the power supply 48, its drain electrode connected to the drain electrode of the PMOS transistor 52, and its gate electrode connected to the control signal line 40.

The reference numeral 51 designates a PMOS transistor (first transistor, or a first PMOS transistor) having its source electrode connected to the signal line 32, and its drain electrode connected to the input terminal of an inverter 58; 52 designates a PMOS transistor (second transistor, or second PMOS transistor) having its source electrode connected to the signal line 36, and its drain electrode connected to the input terminal of an inverter 62, and having a resistance equivalent to that of the PMOS transistor 51. The reference numeral 53 designates an NMOS transistor (first NMOS transistor) having its drain electrode connected to the drain electrode of the PMOS transistor 51 and its gate electrode connected to its drain electrode and to the gate electrode of the PMOS transistor 52; 54 designates an NMOS transistor (second NMOS transistor) having its drain electrode connected to the drain electrode of the PMOS transistor 52 and its gate electrode connected to its drain electrode and to the gate electrode of the PMOS transistor 51, and having a resistance equivalent to that of the NMOS transistor 53. The reference numeral 55 designates an NMOS transistor (third transistor, or third NMOS transistor) having its drain electrode connected to the source electrode of the NMOS transistor 53 and NMOS transistor 54, its source electrode connected to the ground 56, and its gate electrode connected to the control signal line 40; and 56 designates the ground.

The reference numeral 57 designates a switching circuit (data transfer means, or first switching circuit) which compares the voltage $V_3$ of the drain electrode of the PMOS transistor 51 with a threshold voltage $V_{cc}/2$, and transfers a logic signal corresponding to the compared result to a first input terminal of a latch circuit 65; 58 designates an inverter which outputs an L level signal when the voltage $V_3$ of the drain electrode of the PMOS transistor 51 is higher than the threshold voltage $V_{cc}/2$, and outputs an H level signal when it is lower than the threshold voltage; 59 designates the ground; and 60 designates an NMOS transistor (transistor) which transfers to the nonconducting state when the signal level of the output of the inverter 58 falls to L level, and which transfers to the conducting state when it rises to H level.

The reference numeral 61 designates a switching circuit (data transfer means, or second switching circuit) which compares the voltage $V_4$ of the drain electrode of the PMOS transistor 52 with the threshold voltage $V_{cc}/2$, and transfers a logic signal corresponding to the compared result to a second input terminal of the latch circuit 65; 62 designates an inverter which outputs an L level signal when the voltage $V_4$ of the drain electrode of the PMOS transistor 52 is higher than the threshold voltage $V_{cc}/2$, and outputs an H level signal when it is lower than the threshold voltage; 63 designates the ground; and 64 designates an NMOS transistor (transistor) which transfers to the nonconducting state when the signal level of the output of the inverter 62 falls to L level, and which transfers to the conducting state when it rises to H level. The reference numeral 65 designates a latch circuit (second latch circuit) for holding data transferred from the latch circuit 41; and 66 designates an inverter inputting the output of an inverter 67 which in turn inputs the output of the inverter 66.

Next, the operation of the embodiment 1 will be described separately for the two cases: A first term (non-transfer mode) during which the signal levels of the control signal lines 39 and 40 are both L level; and a second term (transfer mode) during which they are both H level.

Figure 2:
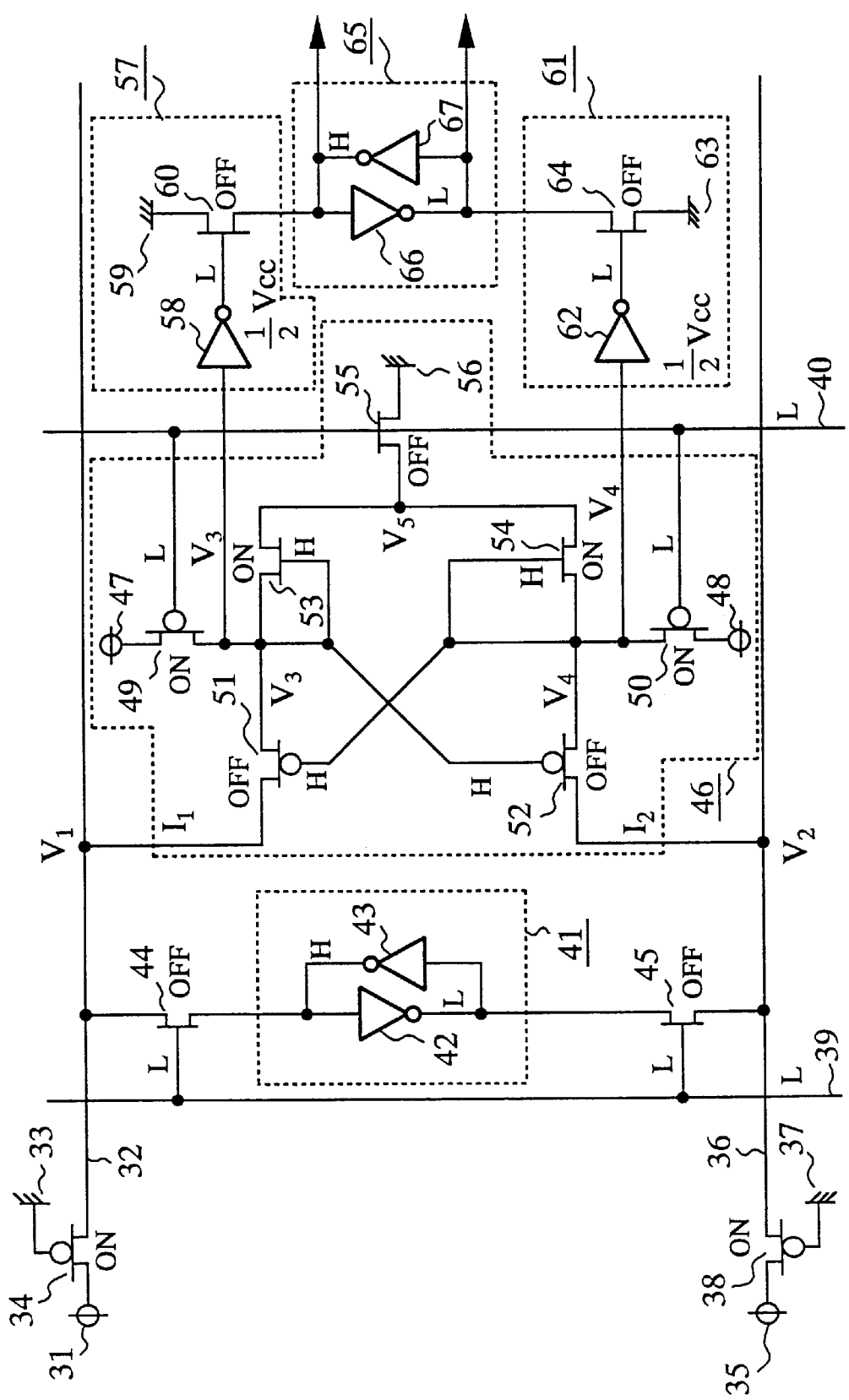
FIG. 2 is a state diagram illustrating the signal levels of various portions and the connecting state of transistors in a first term of the embodiment 1.

First, the operation in the first term will be described with reference to FIG. 2 which shows signal levels of various portions and the connecting state of the transistors. Here, it is assumed for convenience' sake that the output of the inverter 42 is L level and the output of the inverter 43 is H level.

First, since the signal level of the control signal line 39 is L level during the first term, the signal levels of the gate electrodes of the NMOS transistors 44 and 45 are L level, and hence the NMOS transistors 44 and 45 are placed at the nonconducting state.

Accordingly, the latch circuit 41 is isolated from the signal lines 32 and 36, and the data of the latch circuit 41 cannot be transferred to the latch circuit 65 in the first term.

In addition, since the signal level of the control signal line 40 is also L level, the signal levels of the gate electrodes of the PMOS transistors 49 and 50 are L level, and hence the PMOS transistors 49 and 50 are placed at the conducting state.

Accordingly, the power supply 47 is connected to the drain electrode of the PMOS transistor 51 through the PMOS transistor 49, so that the voltage $V_3$ of the drain electrode of the PMOS transistor 51 grows higher than the threshold voltage $V_{cc}/2$ of the inverter 58.

Likewise, the power supply 48 is connected to the drain electrode of the PMOS transistor 52 through the PMOS transistor 50, so that the voltage $V_4$ of the drain electrode of the PMOS transistor 52 grows higher than the threshold voltage $V_{cc}/2$ of the inverter 62.

Incidentally, the sense amplifier 46 does not consume any current in the first term because the signal levels of the gate electrodes of the PMOS transistors 51 and 52 are placed at H level so that the PMOS transistors 51 and 52 are nonconductive, and hence no current pours into the sense amplifier 46 from the signal lines 32 and 36.

Thus, the inverters 58 and 62 each output an L level signal because the voltages $V_3$ and $V_4$ applied to the input terminals of the inverters 58 and 62 of the switching circuits 57 and 61, that is, the voltages of the drain electrodes of the PMOS transistors 51 and 52 are higher than the threshold voltage $V_{cc}/2$.

Accordingly, the NMOS transistors 60 and 64 are both placed at the nonconducting state. Hence, the inverter 67 outputs an H level signal if the output of the inverter 66 is L level. Reversely, if the output of the inverter 66 is H level, the inverter 67 outputs L level.

This means that the latch circuit 65 maintains holding the prestored data independently of the data held by the latch circuit 41 in the first term.

Figure 3:
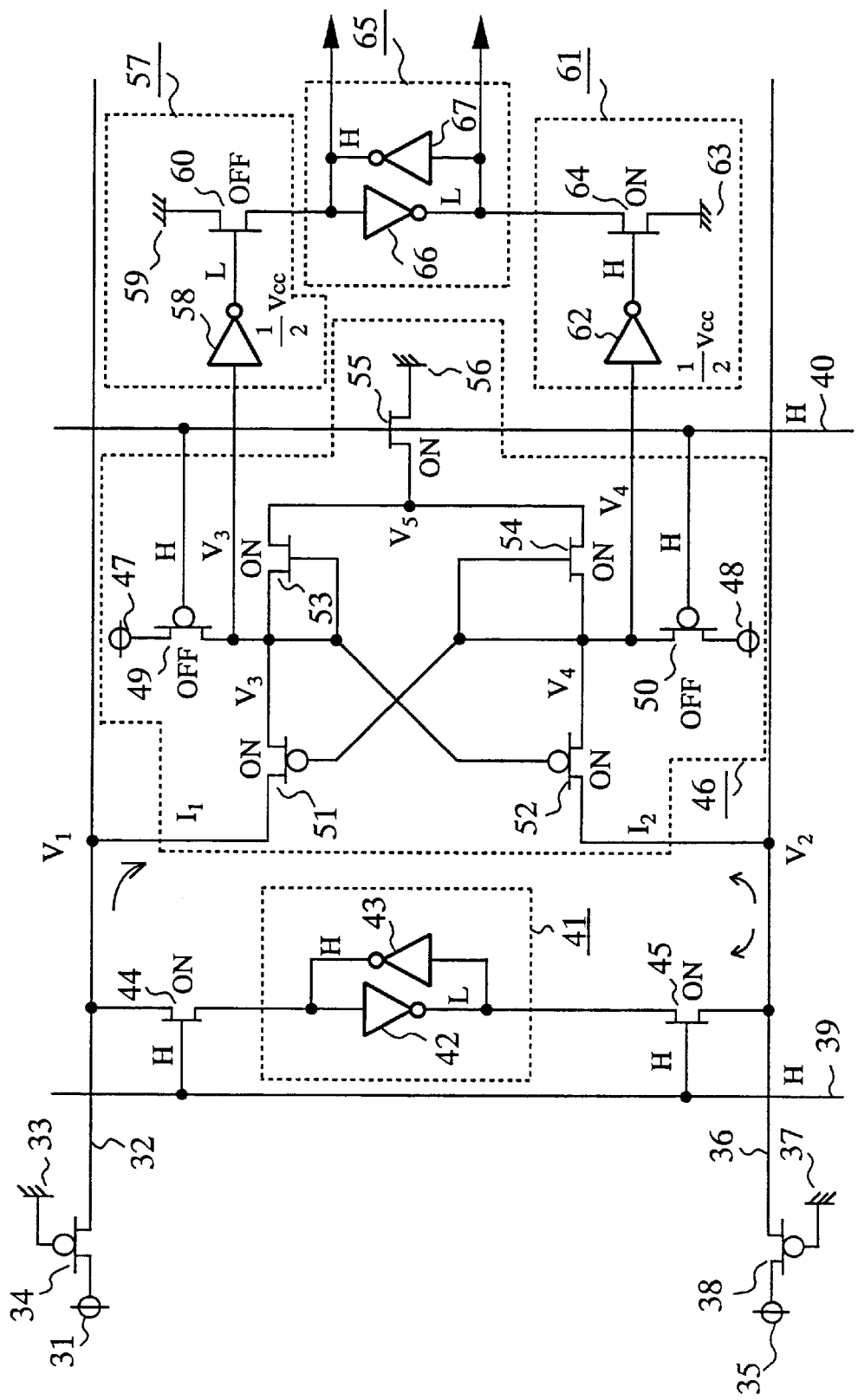
FIG. 3 is a state diagram illustrating the signal levels of various portions and the connecting state of the transistors in a second term of the embodiment 1.
Figure 4A:
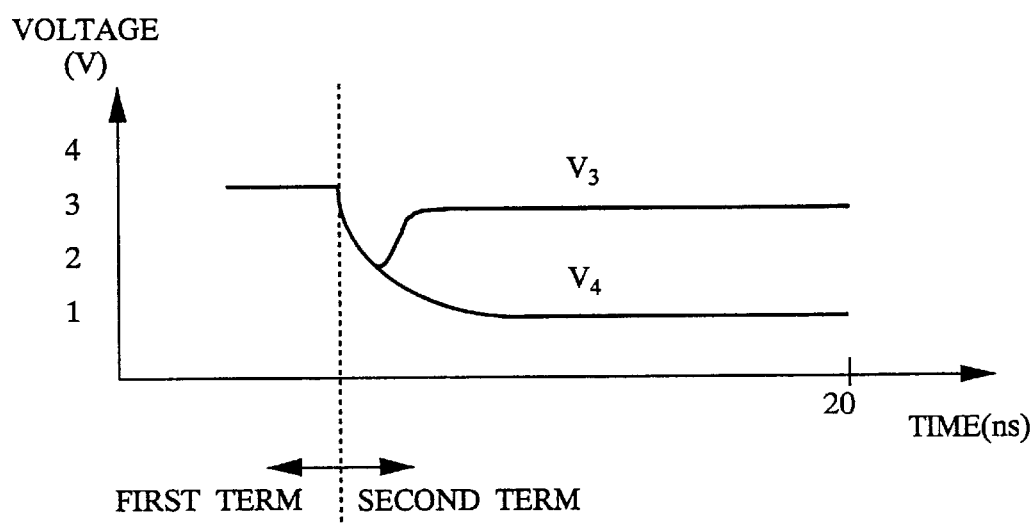

Second, the operation in the second term will be described with reference to FIG. 3 which shows signal levels of various portions and the connecting state of the transistors. Here, it is assumed for convenience' sake that the output of the inverter 42 is L level and the output of the inverter 43 is H level. Incidentally, during the transition from the first term to the second term, the voltages $V_3$ and $V_4$ vary as shown in FIG. 4A, which will help to understand the following description.

First, since the signal level of the control signal line 39 is H level during the second term, the signal levels of the gate electrodes of the NMOS transistors 44 and 45 are H level, and hence the NMOS transistors 44 and 45 are placed at the conducting state.

Accordingly, the latch circuit 41 is connected to the signal lines 32 and 36, and the data of the latch circuit 41 can be transferred to the latch circuit 65 in the second term.

In addition, since the signal level of the control signal line 40 is also H level, the signal levels of the gate electrodes of the PMOS transistors 49 and 50 are H level, and hence the PMOS transistors 49 and 50 are placed at the nonconducting state.

Accordingly, the power supply 47 is separated from the drain electrode of the PMOS transistor 51, and the power supply 48 is also separated from the drain electrode of the PMOS transistor 52.

Thus, the voltage of the power supply 48 is not applied to the gate electrode of the PMOS transistor 51, and the PMOS transistor 51 will conduct when the difference between the voltage $V_1$ of the signal line 32 and the voltage $V_4$ of the drain electrode of the PMOS transistor 52 exceeds the threshold voltage $V_{tp}$ of the PMOS transistor 51.

Likewise, the voltage of the power supply 47 is not applied to the gate electrode of the PMOS transistor 52, and the PMOS transistor 52 will conduct when the difference between the voltage $V_2$ of the signal line 36 and the voltage $V_3$ of the drain electrode of the PMOS transistor 51 exceeds the threshold voltage $V_{tp}$ of the PMOS transistor 52.

In the course of this, the NMOS transistor 53 conducts because its gate electrode is provided with the voltage $V_3$ of the drain electrode of the PMOS transistor 51, and the NMOS transistor 54 also conducts because its gate electrode is provided with the voltage $V_4$ of the drain electrode of the PMOS transistor 52. In addition, the NMOS transistor 55 conducts because the signal level of its gate electrode is H level.

Thus, currents $I_1$ and $I_2$ flow into the sense amplifier 46 from the signal lines 32 and 36, respectively. The current $I_1$ flows into the ground 56 through the PMOS transistor 51 and the NMOS transistors 53 and 55, and the current $I_2$ flows into the ground 56 through the PMOS transistor 52 and the NMOS transistors 54 and 55.

Thus, the magnitudes of the currents $I_1$ and $I_2$ flowing from the signal lines 32 and 36 have an affect on the voltage $V_3$ of the drain electrode of the PMOS transistor 51 and the voltage $V_4$ of the drain electrode of the PMOS transistor 52. In the case of FIG. 3, since the output of the inverter 42 is L level, the current $I_1$ is greater than the current $I_2$ by an amount corresponding to a current flowing into the latch circuit 41 from the signal line 36. This in turn produces, at the drain electrodes of the PMOS transistor 51 and PMOS transistor 52, such voltages $V_3$ and $V_4$ that will cancel the current flowing into the inverter 42 through the NMOS transistor 45.

In this example, although the voltage $V_3$ becomes higher than the voltage $V_4$ (see, FIG. 4A), the voltage $V_1$ on the signal line 32 becomes equal to the voltage $V_2$ on the signal line 36 as follows if PMOS transistors of the same threshold voltage $V_{tp}$ are employed as the PMOS transistors 51 and 52 when embedding them into the unit, and if NMOS transistors of the same threshold voltage $V_{tn}$ are employed as the NMOS transistors 53 and 54 when embedding them into the unit (under the conditions that the β of all the transistors are equal and that they operate in the saturated region). As a result, it is unnecessary for the voltages which have been applied to the signal lines to be discharged to place the signal level of one of the two signal lines to L level, which was required in the conventional unit.

$$I_1 = 0.5 \times \beta \times (V_1 - V_4 - V_{tp})^2$$
$$= 0.5 \times \beta \times (V_3 - V_5 - V_{tn})^2$$
$$I_2 = 0.5 \times \beta \times (V_2 - V_3 - V_{tp})^2$$
$$= 0.5 \times \beta \times (V_4 - V_5 - V_{tn})^2$$
$$\therefore V_1 = V_2 = V_3 + V_4 - V_5 + V_{tp} - V_{tn}$$

As a result, the voltage applied to the input terminal of the inverter 58 in the switching circuit 57, that is, the voltage $V_3$ of the drain electrode of the PMOS transistor 51 is higher than the threshold voltage $V_{cc}/2$ of the inverter 58 so that the inverter 58 outputs the L level signal.

Thus, the NMOS transistor 60 is placed at the nonconducting state because its gate electrode is provided with the L level signal, and hence the input terminal of the inverter 66 in the latch circuit 65 is isolated from the ground 59.

On the other hand, the voltage applied to the input terminal of the inverter 62 in the switching circuit 61, that is, the voltage $V_4$ of the drain electrode of the PMOS transistor 52 is lower than the threshold voltage $V_{cc}/2$ of the inverter 62, and hence the inverter 62 outputs an H level signal.

Thus, the NMOS transistor 64 conducts because its gate electrode is provided with the H level signal, and hence the input terminal of the inverter 67 in the latch circuit 65 is connected to the ground 63.

In this case, the threshold voltage $V_{cc}/2$ of the inverters 58 and 62 can be set at about the middle between the voltages $V_3$ and $V_4$ if the ratio of β of the PMOS transistor to that of NMOS transistor in each of the inverters 58 and 62 is set equal to the ratio of the β of the PMOS transistors 51 and 52 to that of the NMOS transistors 53 and 54. Thus, $$V_3 > V_{cc}/2 > V_4$$

As a result, the inverter 67 outputs the H level signal and the inverter 66 outputs the L level signal because the L level signal is input to the input terminal of the inverter 67 in the latch circuit 65.

Thus, in the second term, the inverter 66 in the latch circuit 65 holds the same data as the data held by the inverter 42 in the latch circuit 41, and the inverter 67 in the latch circuit 65 holds the same data as the data held by the inverter 43 in the latch circuit 41.

According to the embodiment 1, when transferring the data held in the latch circuit 41 to the latch circuit 65, the current $I_1$ flowing into the sense amplifier 46 from the signal line 32 is poured into the ground 56 through the PMOS transistor 51 and the NMOS transistors 53 and 55, and the current $I_2$ flowing into the sense amplifier 46 from the signal line 36 is poured into the ground 56 through the PMOS transistor 52 and the NMOS transistors 54 and 55. This obviates the necessity of discharging the voltage which has been applied to one the signal lines 32 and 36 to place its signal level to L level, which was required in the conventional unit, and hence has an advantage of achieving high speed data transmission in spite of the rather large parasitic capacitance of the signal lines 32 and 36.

Figure 4B:
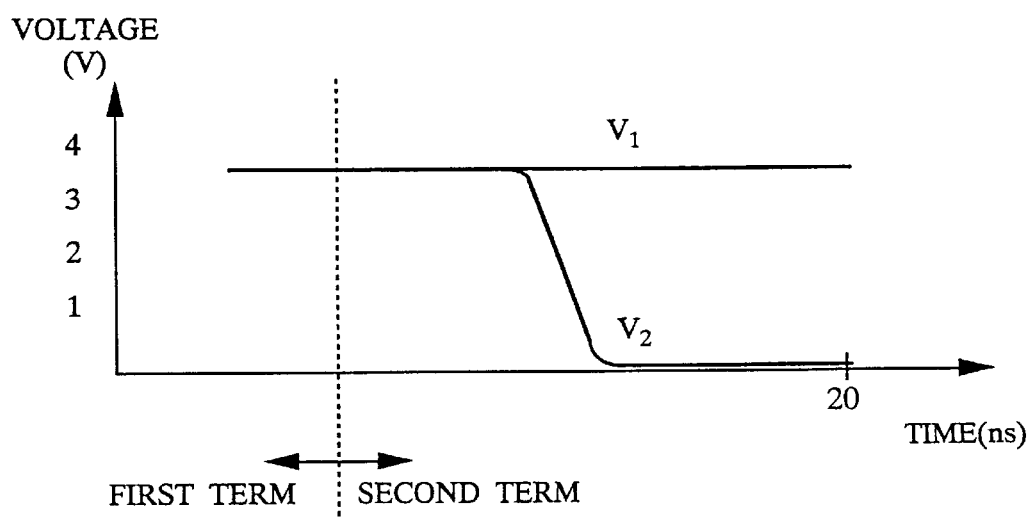

FIGS. 4A and 4B comparatively illustrate simulation results during the transition from the first term to the second term of the embodiment 1 and the conventional example, respectively. As shown in these figures, the time from switching to the time of enabling the data transfer is shorter in the embodiment 1 than in the conventional example.

Embodiment 2

Figure 5:
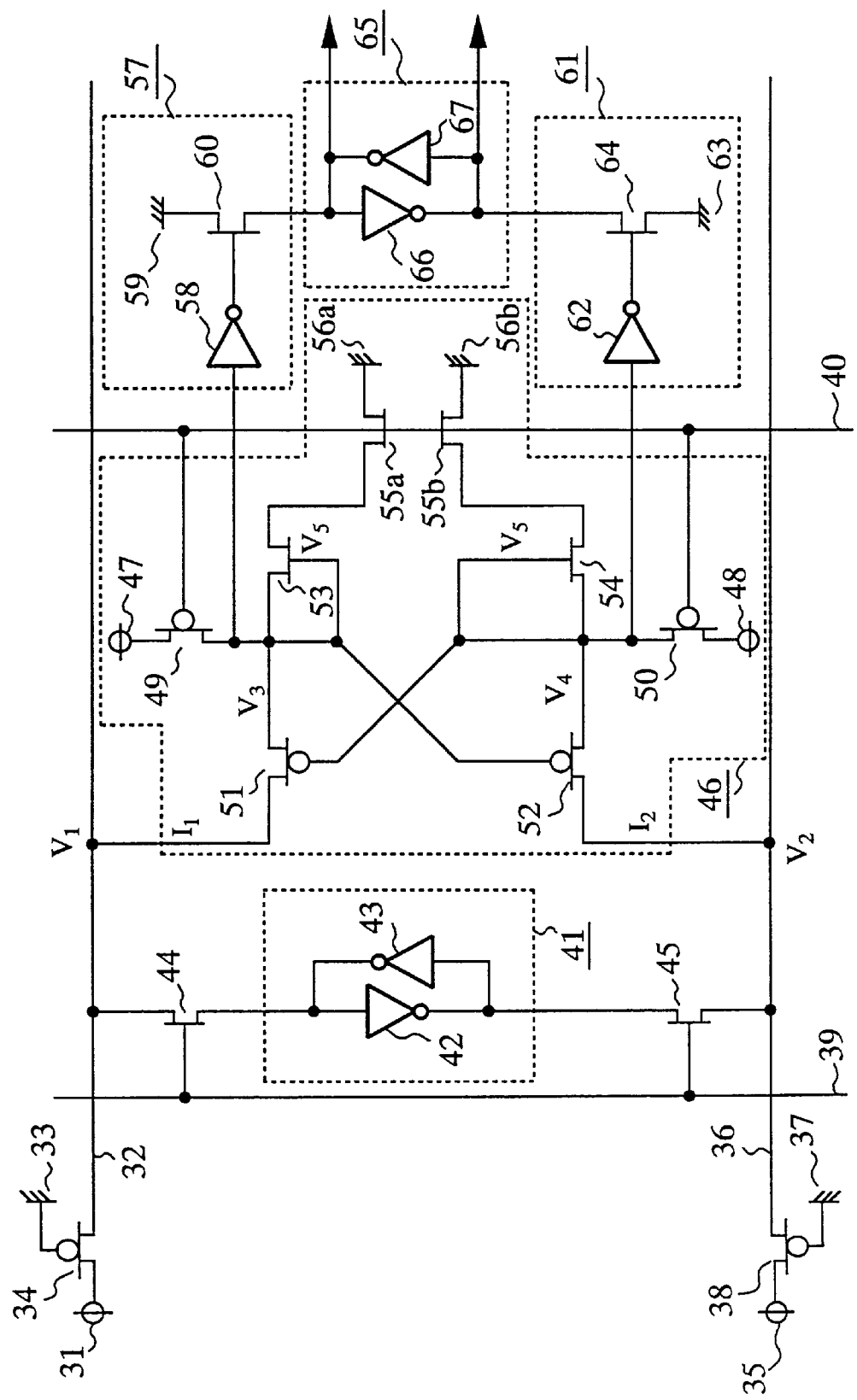
FIG. 5 is a circuit diagram showing an embodiment 2 of the buffer circuit in accordance with the present invention.

Although the single NMOS transistor 55 is used as the third transistor in the embodiment 1, it can be replaced with two NMOS transistors 55a and 55b as shown in FIG. 5, achieving a similar effect as that of the embodiment 1.

Embodiment 3

Figure 6:
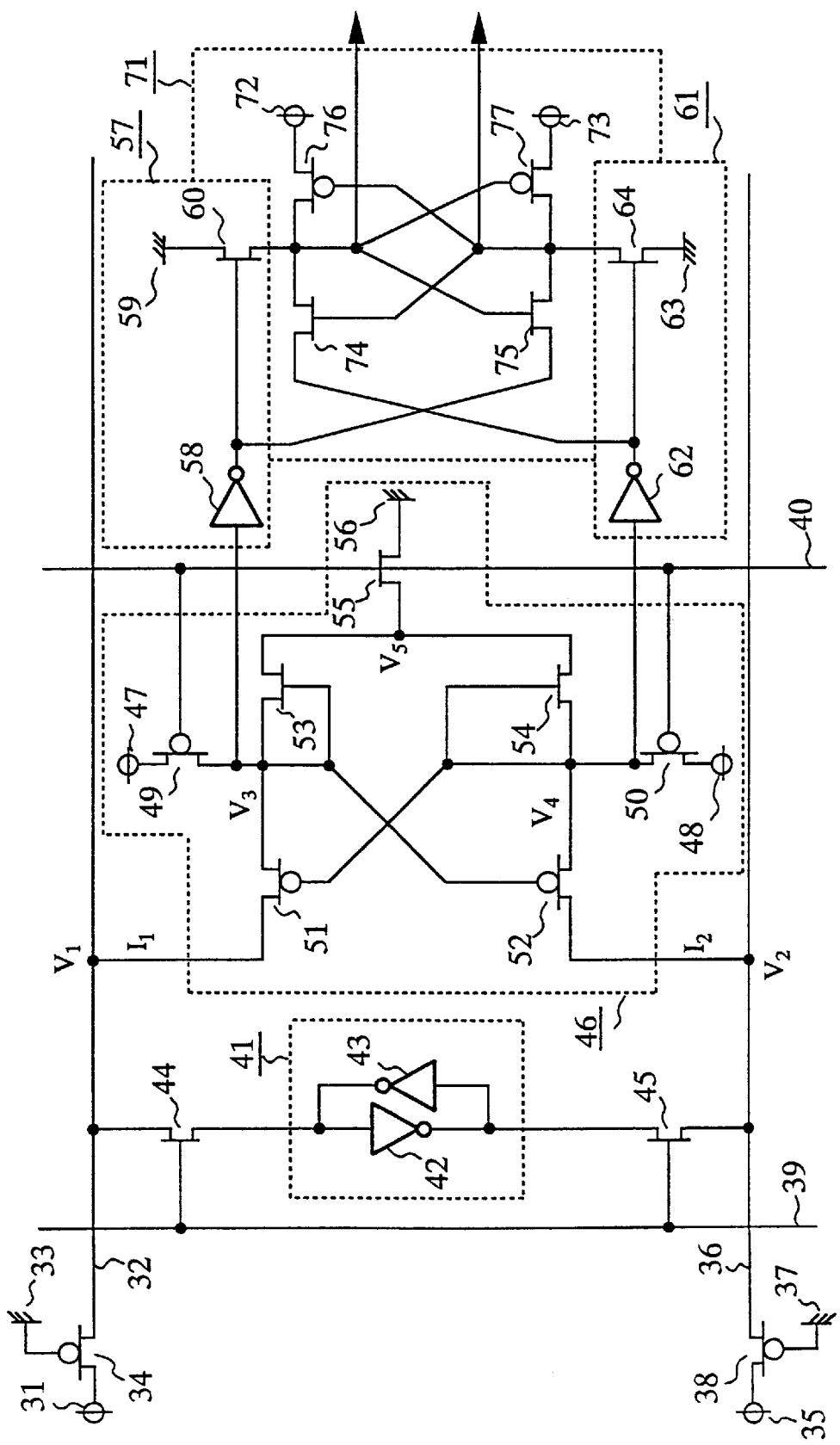
FIG. 6 is a circuit diagram showing an embodiment 3 of the buffer circuit in accordance with the present invention.

FIG. 6 is a circuit diagram showing an embodiment 3 of the buffer circuit in accordance with the present invention, in which the same or like portions to those of FIG. 1 are designated by the same reference numerals and the description thereof is omitted here.

In FIG. 6, the reference numeral 71 designates a latch circuit (second latch circuit) for holding data transferred from the latch circuit 41; 72 and 73 each designate a power supply; 74 designates an NMOS transistor (fourth NMOS transistor) having its source electrode connected to the output terminal of the inverter 62, and its gate electrode connected to the drain electrode of the NMOS transistor 64; 75 designates an NMOS transistor (fifth NMOS transistor) having its source electrode connected to the output terminal of the inverter 58, and its gate electrode connected to the drain electrode of the NMOS transistor 60; 76 designates a PMOS transistor (third PMOS transistor) having its drain electrode connected to the drain electrode of the NMOS transistor 74, its source electrode connected to the power supply 72, and its gate electrode connected to the drain electrode of the NMOS transistor 75; and 77 designates a PMOS transistor (fourth PMOS transistor) having its drain electrode connected to the drain electrode of the NMOS transistor 75, its source electrode connected to the power supply 73, and its gate electrode connected to the drain electrode of the NMOS transistor 74.

Next, the operation will be described.

Since the operation of the embodiment 3 is the same as that of the embodiment 1 except for the latch circuit 71, the operation of the latch circuit 71 will be mainly described. The description will be made separately for the first term and the second term.

First, the operation of the first term will be described with reference to FIG. 7 which shows the signal levels of various portions and the connecting state of the transistors. It is assumed here for convenience' sake that the output of the inverter 42 is L level and the output of the inverter 43 is H level.

First, since the signal levels of the output terminals of the inverters 58 and 62 are L level during the first term as described above, the NMOS transistors 60 and 64 are nonconductive, and hence the latch circuit 71 is isolated from the ground 59 and 63.

Thus, if the signal level of the drain electrode of the NMOS transistor 74 is L level, the signal level of the gate electrode of the PMOS transistor 77 is L level, and hence the PMOS transistor 77 conducts. Accordingly, the voltage of the power supply 73 is applied to the drain electrode of the NMOS transistor 75 and is output from a second output terminal (the lower output terminal in FIG. 6), which places the signal level of the drain electrode of the NMOS transistor 75 and the output of the second output terminal at H level.

Reversely, if the signal level of the drain electrode of the NMOS transistor 75 is L level (not shown in FIG. 6), the signal level of the gate electrode of the PMOS transistor 76 is L level, and hence the PMOS transistor 76 conducts. Accordingly, the voltage of the power supply 72 is applied to the drain electrode of the NMOS transistor 74 and is output from a first output terminal (the upper output terminal in FIG. 6), which places the signal level of the drain electrode of the NMOS transistor 74 and the output of the first output terminal at H level.

Figure 8:
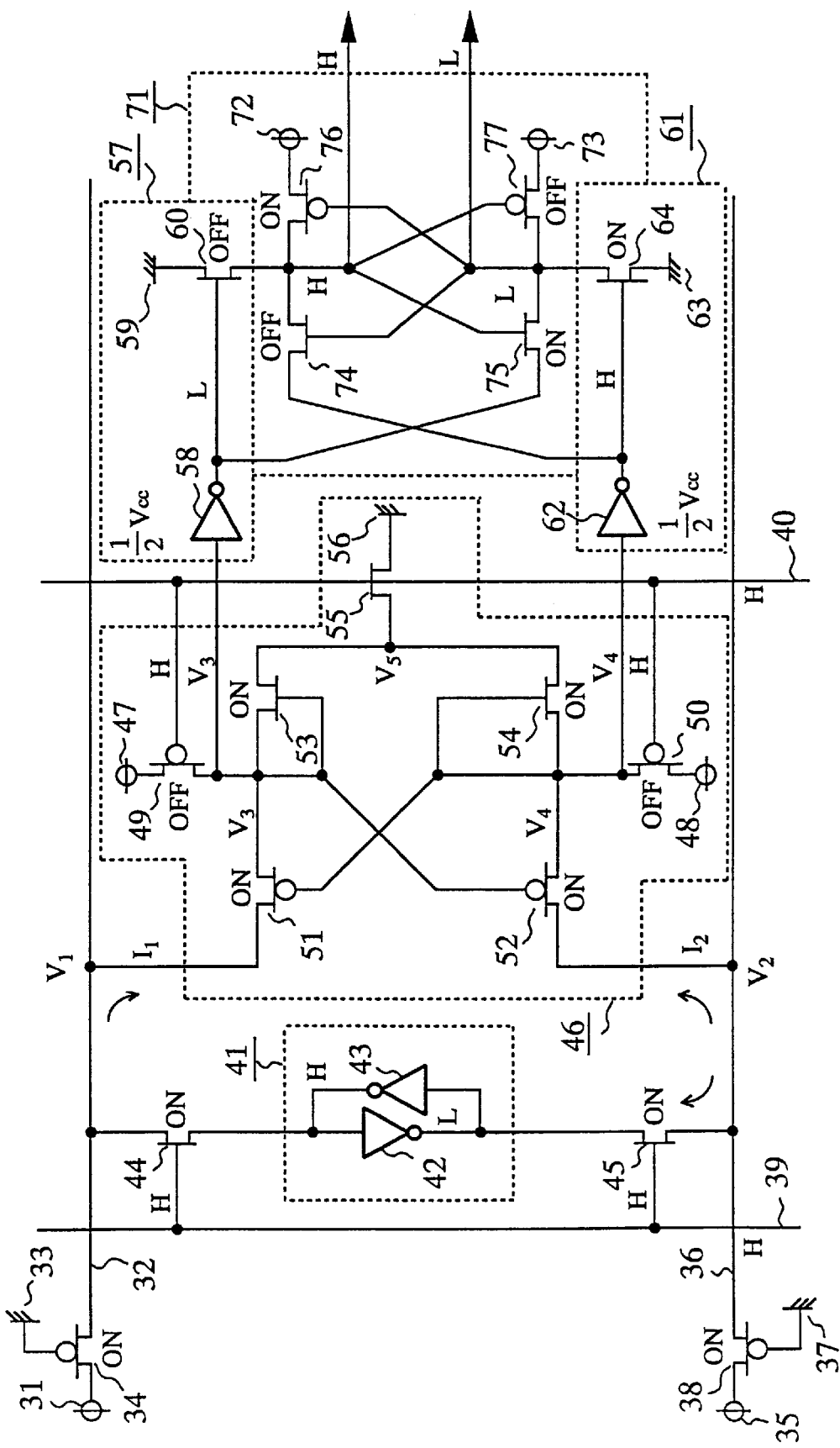
FIG. 8 is a state diagram illustrating the signal levels of various portions and the connecting state of the transistors in the second term of the embodiment 3.

Second, the operation of the second term will be described with reference to FIG. 8 which shows the signal levels of various portions and the connecting state of the transistors. It is also assumed here for convenience' sake that the output of the inverter 42 is L level and the output of the inverter 43 is H level.

First, since the signal level of the output terminal of the inverter 58 is L level during the second term as described above, the NMOS transistor 60 is nonconductive, and hence the latch circuit 71 is isolated from the ground 59.

On the other hand, since the signal level of the output terminal of the inverter 62 is changed to H level, the NMOS transistor 64 conducts, and hence the latch circuit 71 is connected to the ground 63.

Thus, since the signal level of the drain electrode of the NMOS transistor 75 is L level, the signal level of the gate electrode of the PMOS transistor 76 is L level, and hence the PMOS transistor 76 conducts. Accordingly, the voltage of the power supply 72 is applied to the drain electrode of the NMOS transistor 74 and is output from the first output terminal (the upper output terminal in FIG. 6), which places the signal level of the drain electrode of the NMOS transistor 74 and the output of the first output terminal at H level.

Figure 7:
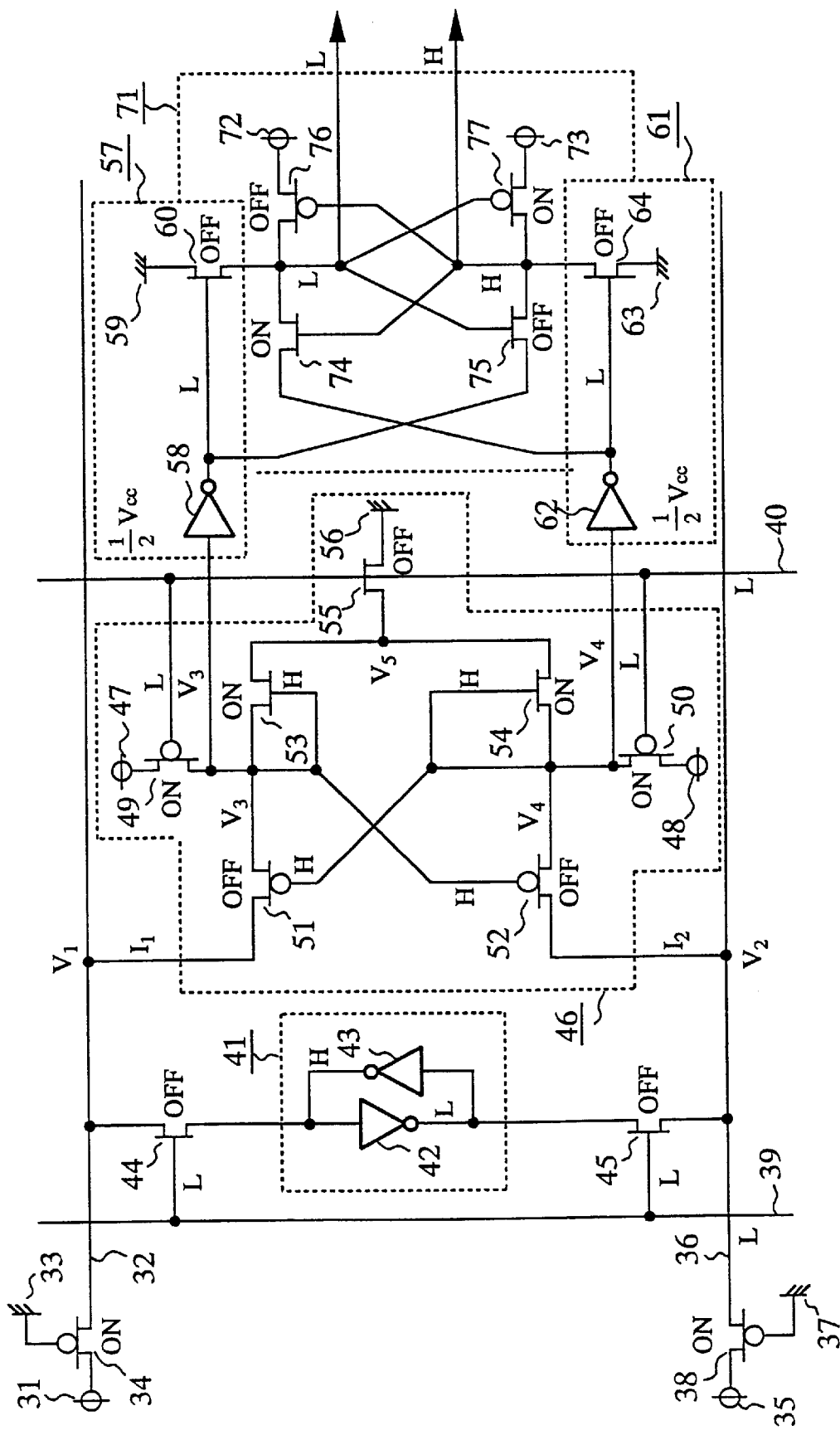
FIG. 7 is a state diagram illustrating the signal levels of various portions and the connecting state of transistors in the first term of the embodiment 3.

This means that the signal level of the drain electrode of the NMOS transistor 74 must be pulled up to H level from L level which was the signal level in the first term as shown in FIG. 7. The pulling up using the power supply 72 is expected to take a certain time because the NMOS transistor 64 and the PMOS transistor 76 must be changed from the nonconducting to conducting state.

However, since the NMOS transistor 74 is in the conducting state in the first term, the signal level of the output of the inverter 62 in the second term, that is, the H level signal passes through the NMOS transistor 74 and appears at its drain electrode. Thus, the signal level of the drain electrode of the NMOS transistor 74 immediately becomes H level without waiting for the pulling up using the power supply 72.

Incidentally, although the NMOS transistor 74 changes its state from the conducting state to the nonconducting state owing to the L level signal applied to its gate electrode in the second term, this poses no problem with the operation because the change in the state does not occur until the NMOS transistor 64 has changed its state from the nonconducting to conducting state, and hence the output of the inverter 62 passes through the NMOS transistor 74 earlier than that.

According to the embodiment 3, the latch circuit 71 is composed of the two PMOS transistors 74 and 75 and the two NMOS transistors 76 and 77, so that the data can be output from the latch circuit 71 prior to the transition of the connecting state of the NMOS transistor 64 and other transistors. This has an advantage of enabling the data transmission to be achieved at a higher speed than in the embodiment 1.

Embodiment 4

Figure 9:
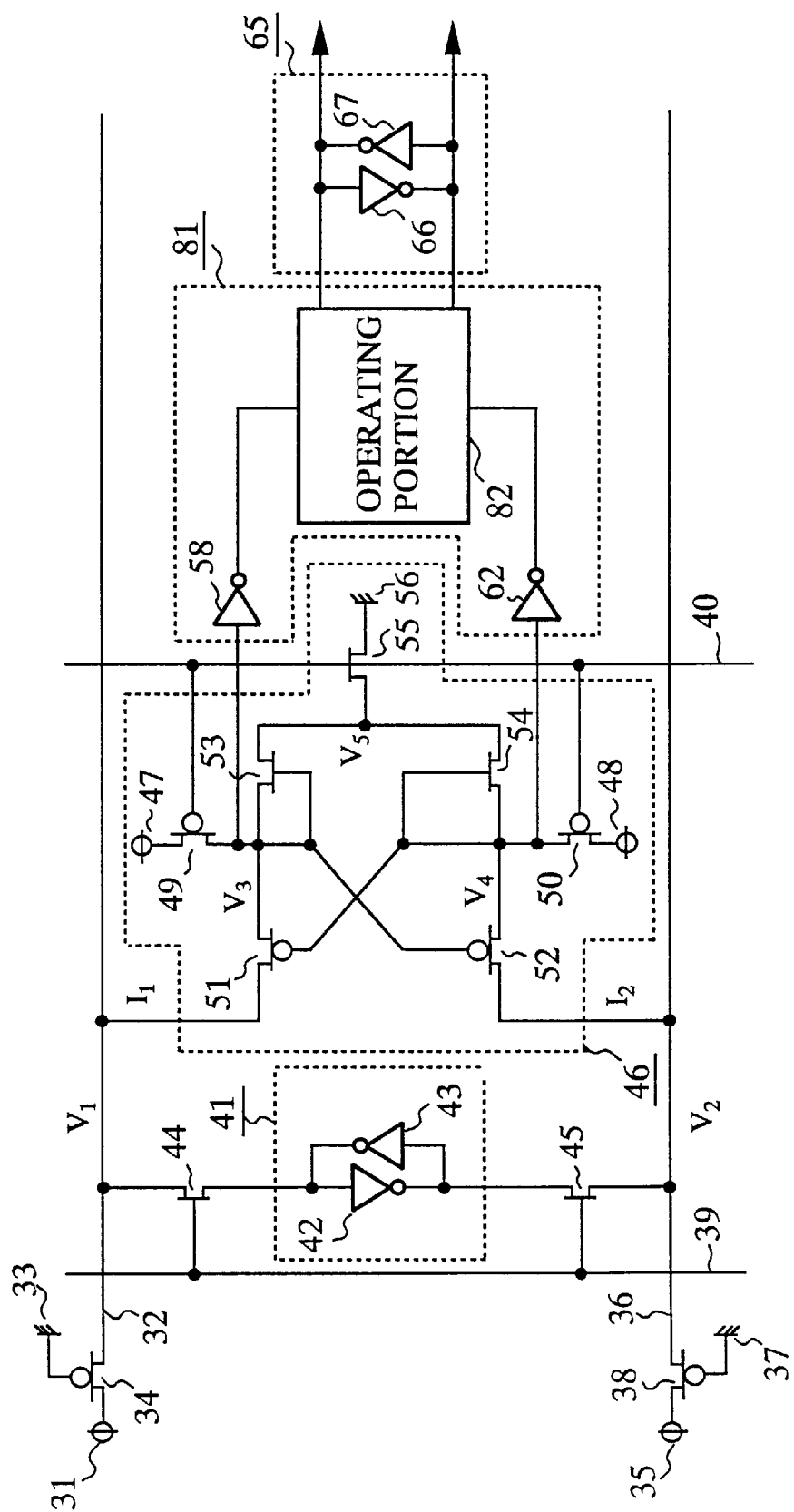
FIG. 9 is a circuit diagram showing an embodiment 4 of the buffer circuit in accordance with the present invention.

FIG. 9 is a circuit diagram showing an embodiment 4 of the buffer circuit in accordance with the present invention, in which the same or like portions to those of FIG. 1 are designated by the same reference numerals and the description thereof is omitted here.

In FIG. 9, the reference numeral 81 designates a switching circuit (data transfer means) for carrying out a predetermined logical operation in response to the compared result between the outputs of the inverters 58 and 62; and 82 designates an operating portion for carrying out the logical operation.

Figure 10:
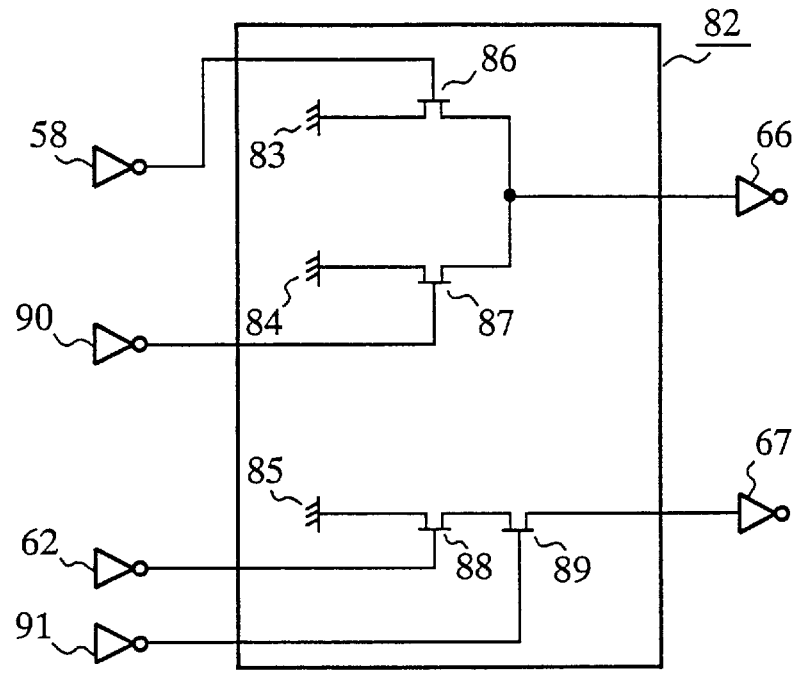
FIG. 10 is a circuit diagram showing an operating portion 82 of the embodiment 4.

FIG. 10 is a circuit diagram showing the details of the operating portion 82. In FIG. 10, the reference numerals 83, 84 and 85 each designate the ground; 86 designates an NMOS transistor having its gate electrode connected to the output terminal of the inverter 58; 87 designates an NMOS transistor having its gate electrode connected to the output terminal of an inverter 90; 88 designates an NMOS transistor having its gate electrode connected to the output terminal of the inverter 62; 89 designates an NMOS transistor having its gate electrode connected to the output terminal of an inverter 90; and 90 and 91 each designate an NMOS transistor provided separately from the buffer circuit.

Next, the operation will be described.

Since the operation of the embodiment 4 is by and large the same as that of the embodiment 1 except for the operating portion 82, the operation of the operating portion 82 will be mainly described.

Figure 11:
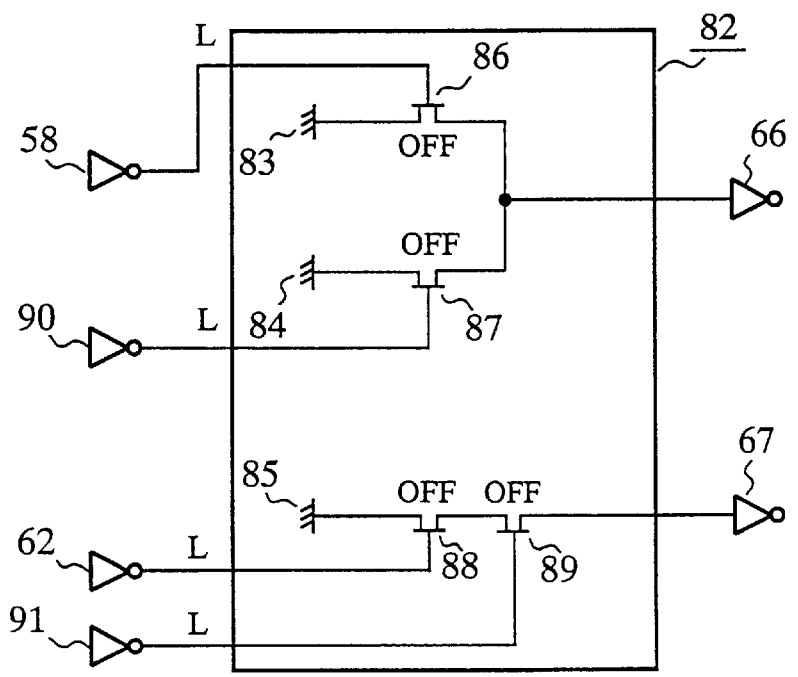
FIG. 11 is a state diagram illustrating the signal levels of various portions and the connecting state of transistors in the operating portion 82 during the first term of the embodiment 4.

First, the operation of the first term will be described with reference to FIG. 11 illustrating the state of the transistors 86–89, which is determined by the low level signals output from the inverters 58 and 62 during the first term as described above. It is assumed in FIG. 11 for convenience' sake that the L level signals are output from the inverters 90 and 91.

Accordingly, the input terminal of the inverter 66 of the latch circuit 65 is isolated from the ground 83 and 84, and the input terminal of the inverter 67 is also isolated from the ground 85, so that the inverters 66 and 67 constituting the latch circuit 65 continue holding the prestored data.

Next, the operation in the second term will be described. In the second term, the logic level of the output of the inverter 58 is opposite to that of the inverter 62. Thus, it is assume here for the convenience' sake that the inverter 58 outputs an L level signal and the inverter 62 outputs an H level signal, and that the inverter 90 outputs an L level signal and the inverter 91 outputs an H level signal (the inverters 90 and 91 have opposite logic levels in the second term as the inverters 58 and 62).

Figure 12:
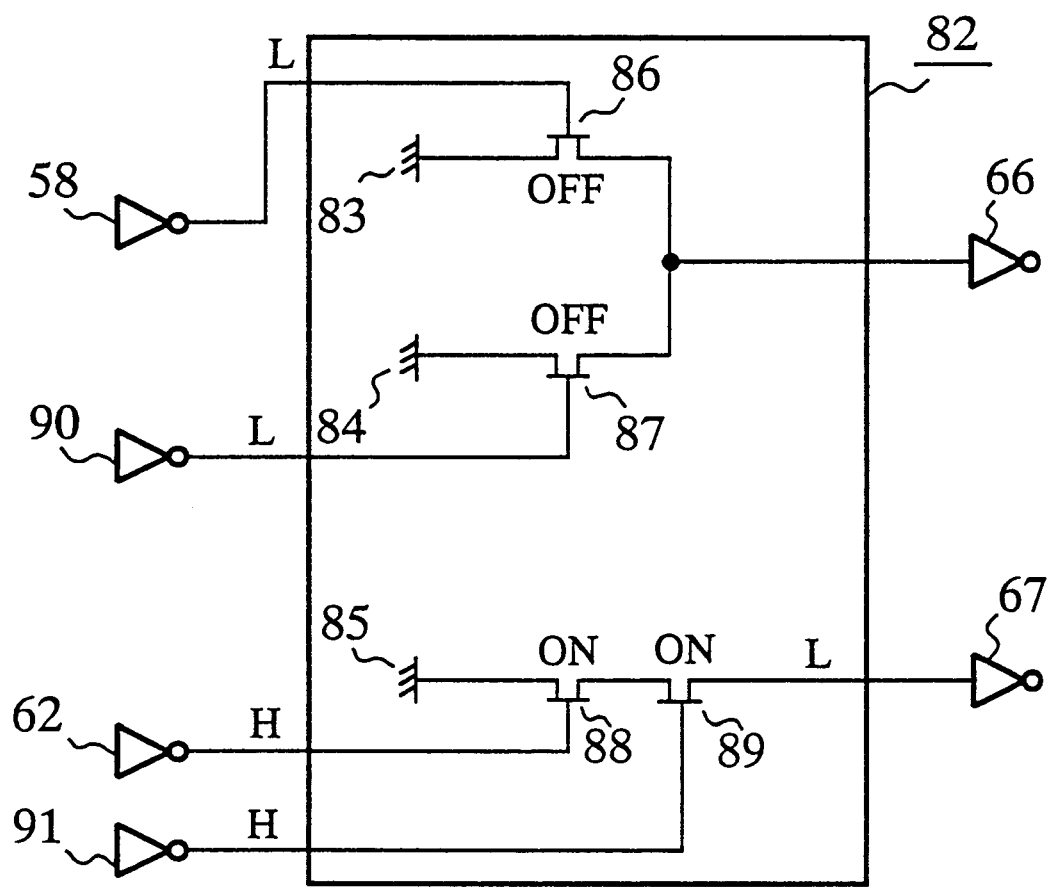
FIG. 12 is a state diagram illustrating the signal levels of various portions and the connecting state of the transistors in the operating portion 82 during the second term of the embodiment 4.

As a result, the state of the NMOS transistors 86–89 are as shown in FIG. 12. The signal level of the input terminal of the inverter 67 is L level because the input terminal is connected to the ground 85 through the NMOS transistors 88 and 89. In other words, the input terminal of the inverter 67 is supplied with a signal corresponding to the logical NAND of the outputs of the inverters 62 and 91.

On the other hand, the signal level of the input terminal of the inverter 66 is placed at H level because the input terminal of the inverter 66 is isolated from the ground 83 and 84 (and is supplied with the output of the inverter 67).

According to the embodiment 4, the predetermined logical operation is simultaneously carried out during the data transfer of the latch circuit 41. This has an advantage of enabling the logical operation to be achieved at a higher speed than when the logical operation is carried out after the data transfer to the latch circuit 65 has been completed.

Although it is assumed that the inverters take the signal levels as shown in FIGS. 11 and 12, this is not essential. In addition, although the logical AND is carried out as the predetermined logical operation, other logical operations such as logical OR can also be performed.

Embodiment 5

Figure 13:
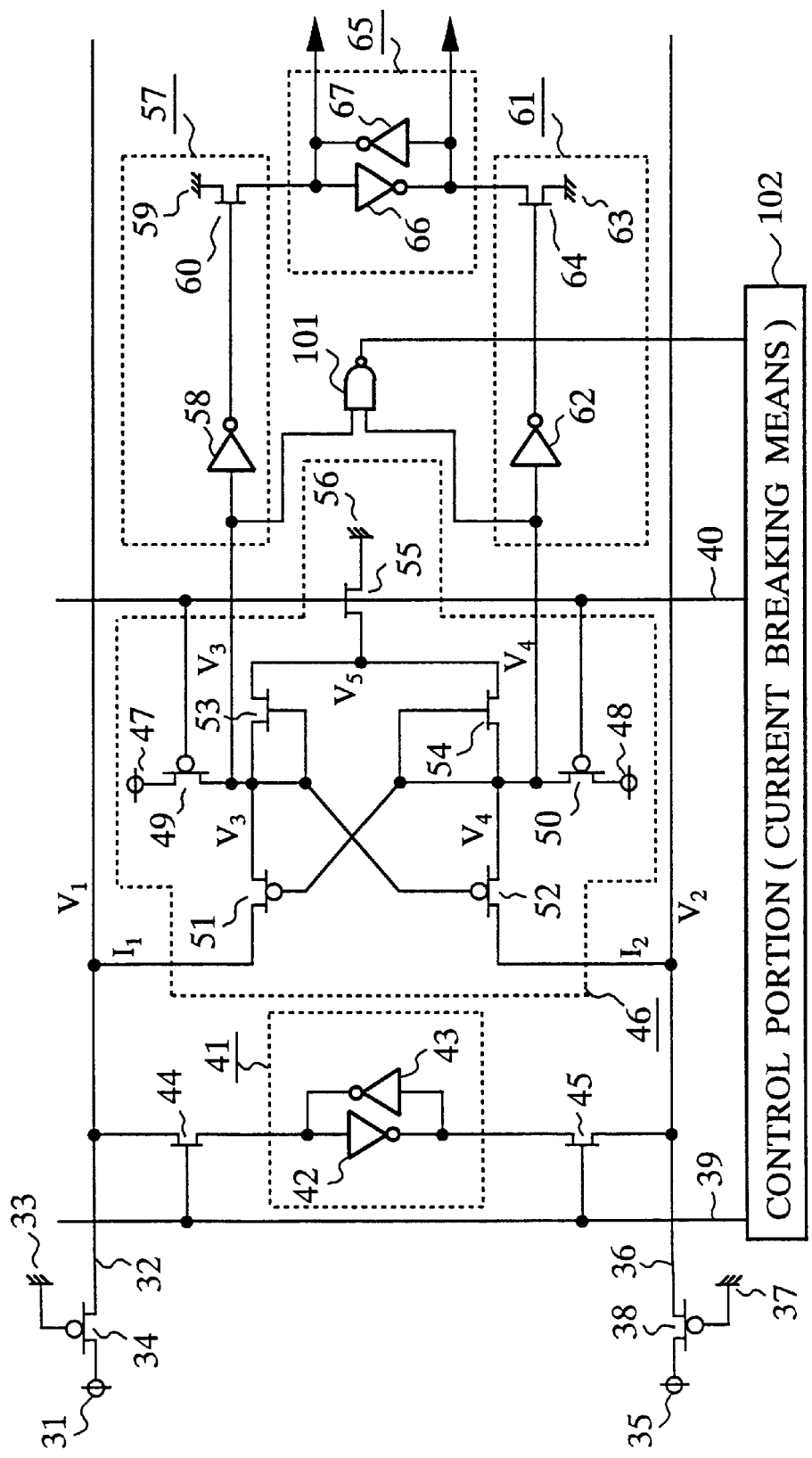
FIG. 13 is a circuit diagram showing an embodiment 5 of the buffer circuit in accordance with the present invention.
Figure 14:
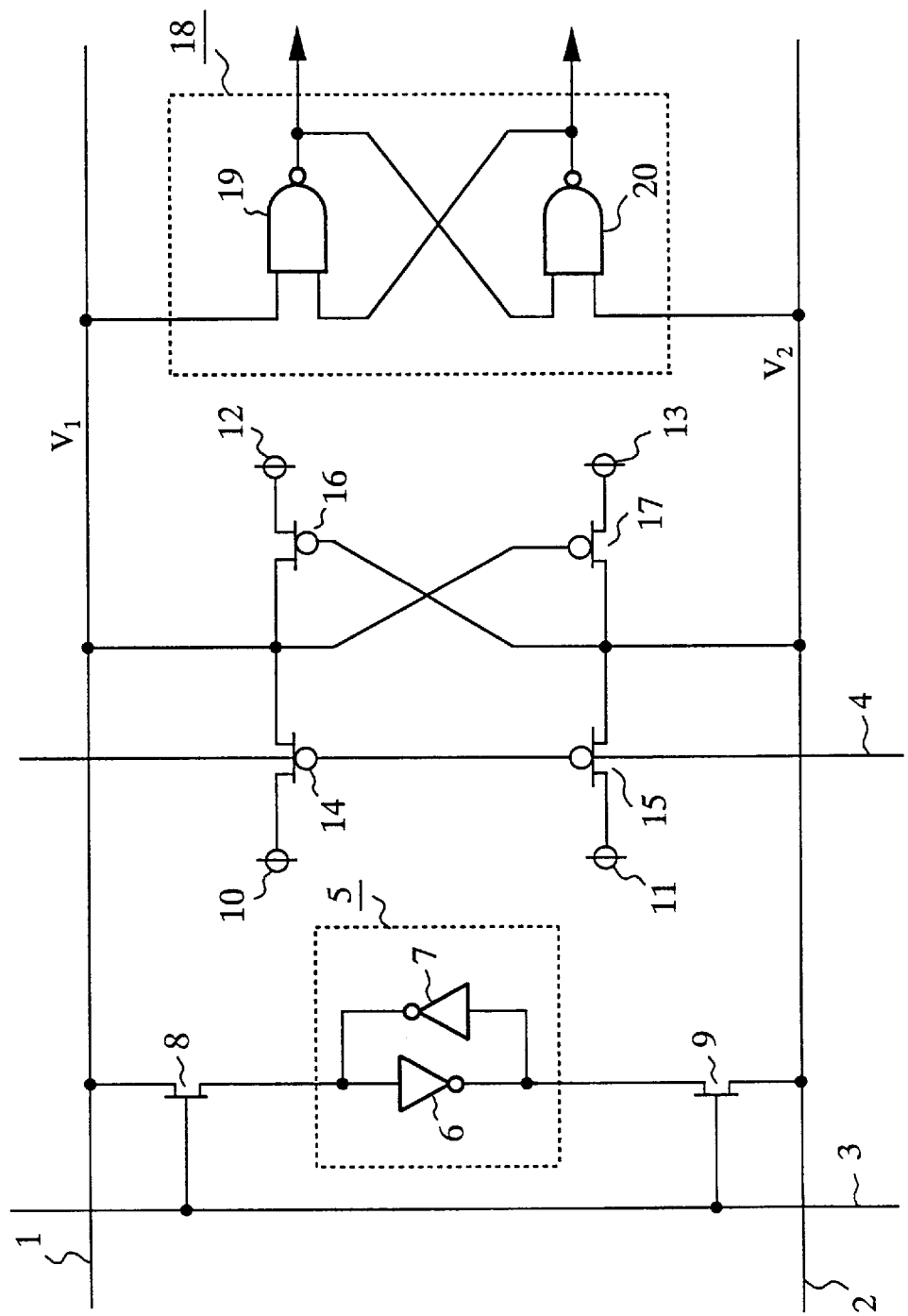
FIG. 14 is a circuit diagram showing a conventional buffer circuit.
Figure 15:
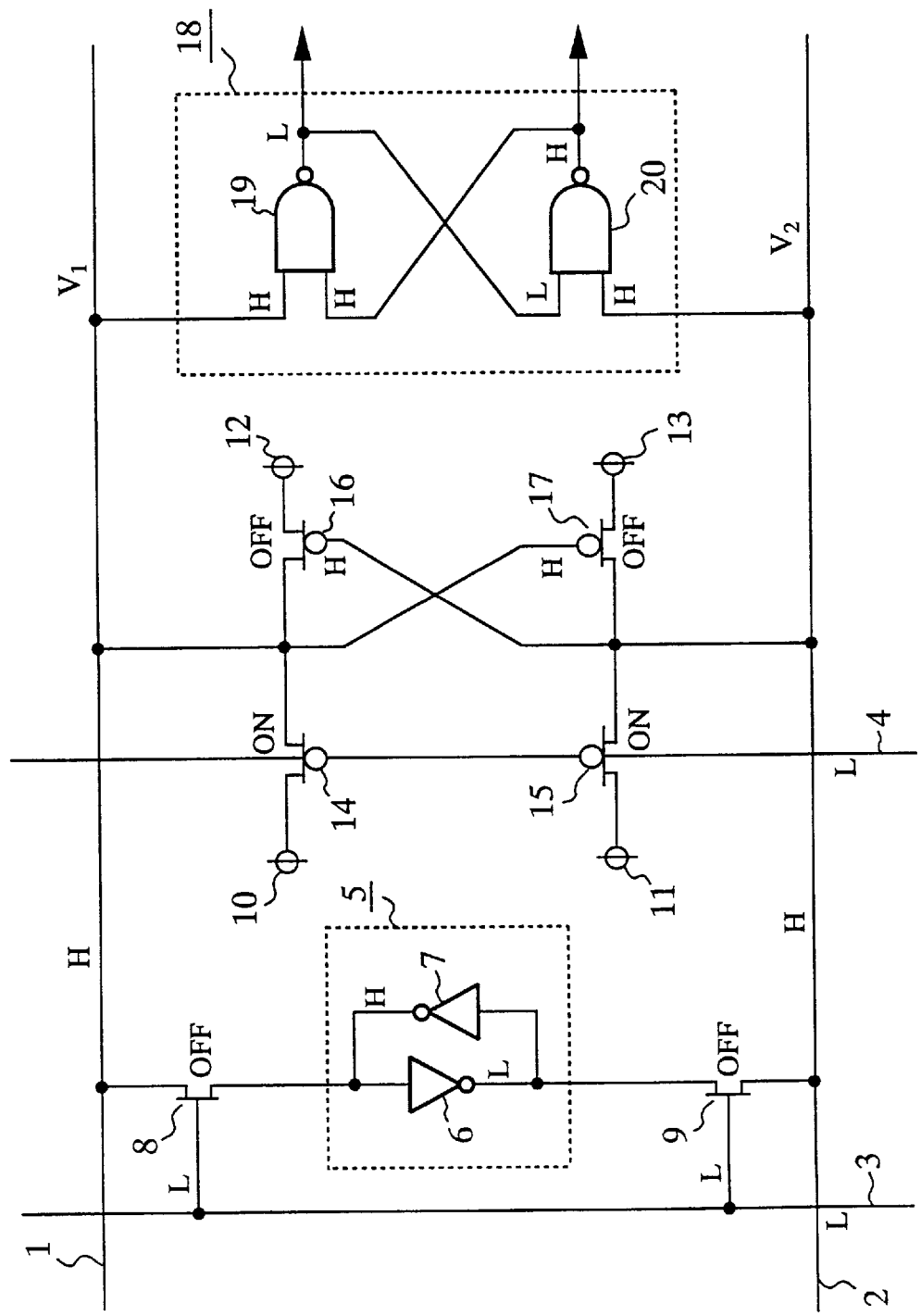
FIG. 15 is a state diagram illustrating the signal levels of various portions and the connecting state of transistors in the first term of the conventional buffer circuit.
Figure 16:
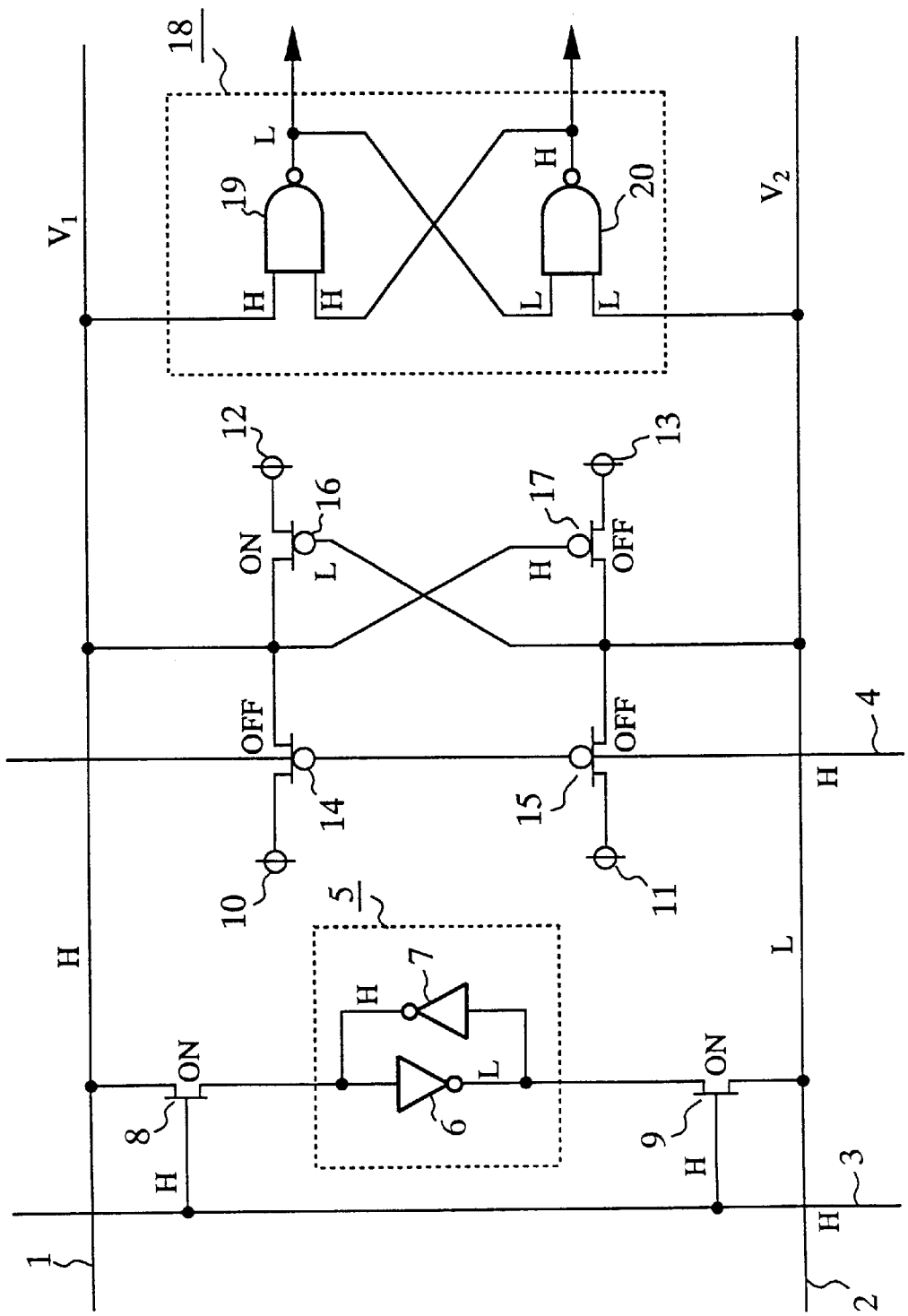
FIG. 16 is a state diagram illustrating the signal levels of various portions and the connecting state of the transistors in the second term of the conventional buffer circuit.

FIG. 13 is a circuit diagram showing an embodiment 5 of the buffer circuit in accordance with the present invention, in which the same or like portions to those of FIG. 1 are designated by the same reference numerals and the description thereof is omitted here.

In FIG. 13, the reference numeral 101 designates a NAND gate (current breaking means) that outputs an H level signal if at least one of the voltages $V_3$ and $V_4$ drops below the threshold voltage $V_{cc}/2$ of the inverters 58 and 62. Here, $V_3$ is the voltage of the drain electrode of the PMOS transistor 51 and $V_4$ is the voltage of the drain electrode of the PMOS transistor 52. The reference numeral 102 designates a control circuit (current breaking means) for placing the signal levels of the control signal lines 39 and 40 at L level when the NAND gate 101 outputs an H level signal.

Next, the operation will be described.

Since the operation of the embodiment 5 is the same as that of the embodiment 1 except for the NAND gate 101 and control circuit 102, their operation will be mainly described.

First, when the second term begins, at least one of the voltages $V_3$ and $V_4$ drops below the threshold voltage $V_{cc}/2$ of the inverters 58 and 62, which enables the data held by the latch circuit 41 to be transferred to the latch circuit 65.

The data transfer to the latch circuit 65 is completed once the signals has been input to the input terminals of the inverters 58 and 62, and hence it is meaningless to continue inputting the same signals to the input terminals of the inverters 58 and 62.

Furthermore, continuing applying the same signals to the input terminals of the inverters 58 and 62 can cause waste of the currents because this causes the currents $I_1$ and $I_2$ to continue flowing from the signal lines 32 and 36 to the ground 56 through the PMOS transistors 51 and 52 and so on.

Considering this, in the embodiment 5, the NAND gate 101 outputs the H level signal if at least one of the voltage $V_3$ of the drain electrode of the PMOS transistor 51 and the voltage $V_4$ of the drain electrode of the PMOS transistor 52 falls below the threshold voltage $V_{cc}/2$ of the inverters 58 and 62.

Receiving the H level signal from the NAND gate 101, the control circuit 102 places the signal levels of the control signal lines 39 and 40 at L level to shift the operation mode to the first term, thereby interrupting the currents $I_1$ and $I_2$. The currents $I_1$ and $I_2$ are interrupted by shifting the operation mode to the first term because the state of the PMOS transistors 51 and 52 and so on changes to the nonconducting state.

Incidentally, the shifting to the first term poses no problem because the latch circuit 65 keeps the same data in the first term as described above, and hence it has no effect on the content of the data held by the latch circuit 65.

According to the embodiment 5, the state of the PMOS transistors 51 and 52 and so on is changed to the nonconducting state, if at least one of the voltage $V_3$ of the drain electrode of the PMOS transistor 51 and the voltage $V_4$ of the drain electrode of the PMOS transistor 52 falls below the threshold voltage $V_{cc}/2$ of the inverters 58 and 62. As a result, the currents $I_1$ and $I_2$ are interrupted after the completion of the data transfer, offering an advantage of reducing the consumed power.

What is claimed is:

1. A buffer circuit carrying out data transfer from a first latch circuit to a second latch circuit through a first signal line and a second signal line in response to control signals applied to a first control signal line and a second control signal line, each of said first signal line and said second signal line being connected to a power supply, and said first latch circuit having a first output terminal and a second output terminal, each of which is connected to one of said first signal line and said second signal line through a transistor whose gate is connected to the first control signal line, said buffer circuit comprising:

a sense amplifier having a first input terminal connected to said first signal line and a second input terminal connected to said second signal line, said sense amplifier pouring a current, which flows into said sense amplifier from said first input terminal, into ground through a first transistor and a third transistor whose gate electrode is connected to said second control signal line, and pouring a current, which flows into said sense amplifier from said second input terminal, into the ground through a second transistor and said third transistor, said second transistor having a resistance equivalent to that of said first transistor; and data transfer means for transferring logic signals to a first input terminal and a second input terminal of said second latch circuit, said logic signals corresponding to compared results obtained by said data transfer means which compares an output side voltage of said first transistor of said sense amplifier with a reference voltage and compares an output side voltage of said second transistor of said sense amplifier with the reference voltage.

2. The buffer circuit as claimed in claim 1, wherein said first transistor in said sense amplifier comprises a first PMOS transistor having its source electrode connected to said first signal line, and its drain electrode connected to said data transfer means, wherein said second transistor in said sense amplifier comprises a second PMOS transistor having its source electrode connected to said second signal line, and its drain electrode connected to said data transfer means, and wherein said third transistor in said sense amplifier comprises:

a first NMOS transistor having its drain electrode connected to the drain electrode of said first PMOS transistor, and its gate electrode connected to a gate electrode of said second PMOS transistor;

a second NMOS transistor having its drain electrode connected to said drain electrode of said second PMOS transistor, and its gate electrode connected to a gate electrode of said first PMOS transistor; and a third NMOS transistor having its drain electrode connected to the source electrodes of said first NMOS transistor and said second NMOS transistor, its source electrode connected to the ground, and its gate electrode connected to the second control signal line.

3. The buffer circuit as claimed in claim 2, wherein said sense amplifier applies a voltage higher than the reference voltage to the drain electrodes of said first PMOS transistor and said second PMOS transistor, when the output terminals of said first latch circuit are isolated from said first signal line and said second signal line.

4. The buffer circuit as claimed in claim 1, wherein said data transfer means comprises:

a first switching circuit for isolating the first input terminal of said second latch circuit from the ground when the output side voltage of said first transistor is higher than the reference voltage, and for connecting the first input terminal of said second latch circuit to the ground when the output side voltage of said first transistor is lower than the reference voltage; and a second switching circuit for isolating the second input terminal of said second latch circuit from the ground when the output side voltage of said second transistor is higher than the reference voltage, and for connecting the second input terminal of said second latch circuit to the ground when the output side voltage of said second transistor is lower than the reference voltage.

5. The buffer circuit as claimed in claim 4, wherein each of said first switching circuit and said second switching circuit comprises:

an inverter for inverting a logic level of the output side voltage of one of said first transistor and said second transistor; and a transistor for having one of the first and second input terminals of said second latch circuit isolated from the ground when the logic level output from said inverter is a low level, and having it connected to the ground when the logic level output from said inverter is a high level, and wherein said second latch circuit comprises:

a fourth NMOS transistor having its source electrode connected to an output terminal of said inverter of said second switching circuit, and its gate electrode connected to a drain electrode of said transistor of said second switching circuit;

a fifth NMOS transistor having its source electrode connected to an output terminal of said inverter of said first switching circuit, and its gate electrode connected to a drain electrode of said transistor of said first switching circuit;

a third PMOS transistor having its drain electrode connected to a drain electrode of said fourth NMOS transistor, its source electrode connected to a power supply, and its gate electrode connected to a drain electrode of said fifth NMOS transistor; and a fourth PMOS transistor having its drain electrode connected to the drain electrode of said fifth NMOS transistor, its source electrode connected to a power supply, and its gate electrode connected to the drain electrode of said fourth NMOS transistor.

6. The buffer circuit as claimed in claim 1, wherein said data transfer means carries out a predetermined logical operation in response to the compared results, and transfers logic signals corresponding to logical operation results to the first input terminal and the second input terminal of said second latch circuit.

7. The buffer circuit as claimed in claim 2, wherein said data transfer means carries out a predetermined logical operation in response to the compared results, and transfers logic signals corresponding to logical operation results to the first input terminal and the second input terminal of said second latch circuit.

8. The buffer circuit as claimed in claim 3, wherein said data transfer means carries out a predetermined logical operation in response to the compared results, and transfers logic signals corresponding to logical operation results to the first input terminal and the second input terminal of said second latch circuit.

9. The buffer circuit as claimed in claim 1, further comprising a current breaking means for changing a state of said first transistor and said second transistor into a nonconducting state when at least one of the output side voltages of said first transistor and said second transistor drops below the reference voltage.

10. The buffer circuit as claimed in claim 2, further comprising a current breaking means for changing a state of said first transistor and said second transistor into a nonconducting state when at least one of the output side voltages of said first transistor and said second transistor drops below the reference voltage.

11. The buffer circuit as claimed in claim 3, further comprising a current breaking means for changing a state of said first transistor and said second transistor into a nonconducting state when at least one of the output side voltages of said first transistor and said second transistor drops below the reference voltage.

12. The buffer circuit as claimed in claim 4, further comprising a current breaking means for changing a state of said first transistor and said second transistor into a nonconducting state when at least one of the output side voltages of said first transistor and said second transistor drops below the reference voltage.

13. The buffer circuit as claimed in claim 5, further comprising a current breaking means for changing a state of said first transistor and said second transistor into a nonconducting state when at least one of the output side voltages of said first transistor and said second transistor drops below the reference voltage.

14. The buffer circuit as claimed in claim 6, further comprising a current breaking means for changing a state of said first transistor and said second transistor into a nonconducting state when at least one of the output side voltages of said first transistor and said second transistor drops below the reference voltage.

15. The buffer circuit as claimed in claim 7, further comprising a current breaking means for changing a state of said first transistor and said second transistor into a nonconducting state when at least one of the output side voltages of said first transistor and said second transistor drops below the reference voltage.

16. The buffer circuit as claimed in claim 8, further comprising a current breaking means for changing a state of said first transistor and said second transistor into a nonconducting state when at least one of the output side voltages of said first transistor and said second transistor drops below the reference voltage.

* * * * *